United States Patent [19]

Iwasaki et al.

[11] 4,445,040

[45] Apr. 24, 1984

[54] SHAPING APERTURE FOR A CHARGED PARTICLE FORMING SYSTEM

[75] Inventors: Teruo Iwasaki, Hachioji; Norio Saitou, Iruma; Akira Yanagisawa, Ome, all of Japan

[73] Assignee: Hitachi, Ltd., Tokyo, Japan

[21] Appl. No.: 514,352

[22] Filed: Jul. 18, 1983

Related U.S. Application Data

[63] Continuation of Ser. No. 241,071, Mar. 6, 1981, abandoned.

[30] Foreign Application Priority Data

Mar. 7, 1980 [JP] Japan .................................. 55/28137

[51] Int. Cl.³ .............................................. A61K 27/02
[52] U.S. Cl. ................................. 250/452.2; 250/505.1
[58] Field of Search ..................... 250/505, 503, 492.2; 378/149, 150, 157

[56] References Cited

U.S. PATENT DOCUMENTS

| | | | |
|---|---|---|---|
| 3,193,408 | 7/1965 | Triller | 250/512 |
| 3,849,649 | 11/1974 | Carey | 250/511 |
| 3,980,407 | 9/1976 | Hill | 250/511 |
| 4,151,422 | 4/1979 | Goto et al. | 250/495.2 |
| 4,243,866 | 1/1981 | Pfeiffer et al. | 250/492.2 |
| 4,258,265 | 3/1981 | Sumi | 250/492.2 |
| 4,288,697 | 9/1981 | Alber | 250/503 |

*Primary Examiner*—Bruce C. Anderson
*Attorney, Agent, or Firm*—Antonelli, Terry & Wands

[57] ABSTRACT

A shaping aperture used in a charged particle forming system and provided with a slit for shaping the cross section of a charged beam emitted is disclosed in which at least two thin plates each provided with a through-hole for passing the charged particle beam therethrough are piled so as to form a shaping slit of a desired form by the through-holes.

13 Claims, 8 Drawing Figures

SHAPING APERTURE FOR A CHARGED PARTICLE FORMING SYSTEM

This application is a continuation of application Ser. No. 241,071, filed Mar. 6, 1981 abandoned.

BACKGROUND OF THE INVENTION

The present invention relates to an improved shaping aperture for shaping a charged particle beam, which is used in a charged particle forming system included in an electron beam lithography system and the like, into a desired form.

FIG. 1 of the accompanying drawings shows an example of a column (that is, an electron-optical column) included in an electron beam lithography system in which an electron beam is shaped into a desired form and the electron beam thus shaped is employed to write various patterns on a semiconductor substrate (that is, a semiconductor wafer), or to expose various surface portions of a glass mask plate. In FIG. 1, reference numeral 1 designates an electron gun, 2 a condenser lens, 3 a first shaping aperture, 4 an electrostatic deflector, 5 a projection lens, 6 a second shaping aperture, 7 an electrostatic deflector for scanning operation, and 8 a target plane or a sample to be exposed.

Usually in an electron beam lithography system and the like, the shaping apertures 3 and 6 are mounted and fixed in the column, as shown in FIG. 1. FIGS. 2a and 2b show, in an enlarged form, one of the shaping apertures 3 and 6. Referring to FIG. 2a, an electron beam 9 (having a circular cross section) emitted from the electron gun 1 illuminates a shaping aperture 10 in such a manner that a shaping slit 11 (having the form of a square in the example shown in FIGS. 2a and 2b) provided in the shaping aperture 10 is covered with a large region 12 in which the current density is uniform. A shaped electron beam 13 which has passed through the shaping slit 11, is focussed and deflected by means of an electromagnetic lens or the like provided in the succeeding stage, and illuminates the target 8 with a desired demagnification, in order to write a pattern thereon. In many cases, the shaping aperture 10 shown in FIG. 2a is made of a material such as Mo, Pt and Cu, and is formed of a thin plate having a diameter of about 6 mm and a thickness of 10 to 20 μm. The shaping slit 11 measures about 300 μm × 300 μm. When a slit having a size smaller than 500 μm × 500 μm is formed by machining, it is very difficult, if not impossible, to find a cutting method for forming a slit having accurate dimensions.

Accordingly, the operation for providing such a through-hole is performed mainly through photoetching techniques. As a result, as shown in FIG. 2b, there is obtained the slit 11 having corners which are considerably rounded. For example, in the case where the side a of the slit has a length of 250 μm, the radius of curvature of each corner lies within a range from 10 to 30 μm. Such roundness is undesirable, since the roundness is left as a part of a demagnified writing pattern when the demagnified writing pattern is projected onto the target 8. For example, in the case where the above-mentioned side a is 250 μm in length and the total demagnification is made equal to 1/50, the corners (of the slit) having a radius of curvature of 10 μm will produce on the target 8 a pattern having a radius of curvature of 0.2 μm. Accordingly, the roundness of slit corner cannot be neglected when it is required to write an ultra fine pattern, a minimum width of which is less than 1 μm, with high accuracy.

SUMMARY OF THE INVENTION

An object of the present invention is to provide a shaping aperture which can overcome the above-mentioned difficulties, and which is provided with a fine and exact shaping slit in order that a charged particle beam formed in a charged particle forming system included in an electron beam lithography system and the like is prevented from having an undesirable cross section due to the form of shaping slit when the charged particle beam is shaped into a desired form.

In order to attain the above object, according to the present invention, at least two thin plates, each of which is provided with a through-hole, are stacked so that the through-holes form a shaping slit having a desired shape. In more detail, a plurality of thin plates are piled so that corner portions of each of through-holes provided in the thin plates do not appear on a shaping slit formed by the through-holes.

BRIEF DESCRIPTION OF THE DRAWINGS

FIG. 2a is a schematic view of this example, and FIG. 2b is a view for explaining the slit portion of the example.

FIGS. 3a to 3c are views for showing the structure of the above embodiment, and FIG. 3d is a view for explaining a shaping slit formed in the above embodiment.

DESCRIPTION OF THE PREFERRED EMBODIMENTS

Now, the present invention will be explained below in detail with reference to the embodiments thereof.

Figure 2A:
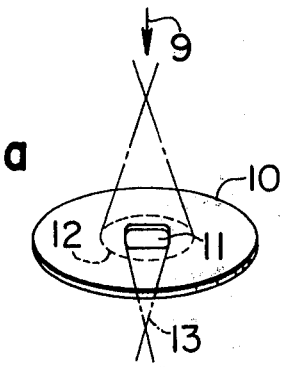
FIGS. 2a and 2b show an example of a conventional shaping aperture.
Figure 2B:
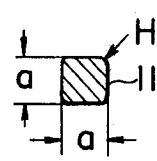
Figure 3A:
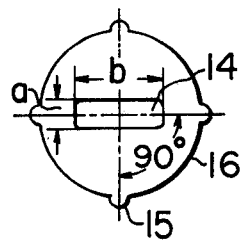
FIGS. 3a to 3d are views for explaining an embodiment of the present invention.
Figure 3B:
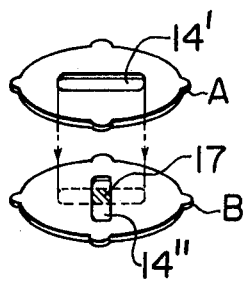
Figure 3C:
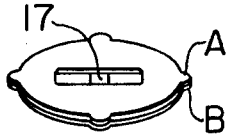
Figure 3D:
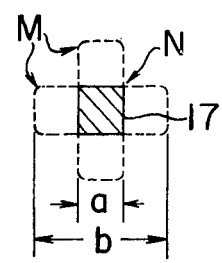

FIGS. 3a to 3d are views for explaining an embodiment of the present invention. Referring to FIG. 3a, an opening 14 (or a through-hole) having a rectangular form, one side a of which is shorter than the other side b, is provided at a central portion of a thin disc, and two to four positioning projections 15 are formed on the circumference of the thin disc at a predetermined angular interval. Thus, a shaping aperture 16 is formed. In the embodiment illustrated, four positioning projections 15 are provided at an angular interval of 90 degrees. Further, the positioning projections may be replaced by positioning grooves. As shown in FIG. 3b, a pair of shaping apertures A and B, each of which is identical with the shaping aperture 16, are placed opposite to each other in a state that the apertures A and B are rotated 90 degrees from each other. Then, as shown FIG. 3c, the apertures A and B are brought into contact with each other on the basis of the positioning projections so that openings 14' and 14" are close to each other, and are mounted on and fixed to a shaping slit holder provided in the electron-optical column. Thus, a shaping slit 17 having the form of a square such as indicated by a hatched area in FIG. 3d, is readily obtained. The shaping slit 17 has a very sharp, exact square or rectangular form as compared with the shaping slit 11 shown in FIG. 2b, since the corners N of the shaping slit 17 are formed by central portions of the long sides b in order not to have any relation with the corners M of the openings 14' and 14". Accordingly, in a case where a minimum pattern having a size of 1 μm×1 μm is required to be exactly written on the target 8 and the total demagnification is equal to 1/50, the area a×b shown in FIG. 3a is made equal to 50 μm×500 μm.

Figure 1:
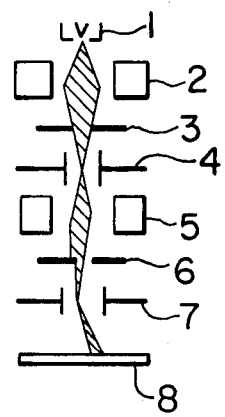
FIG. 1 is a schematic view showing the structure of an example of an electron-optical column.
Figure 4:
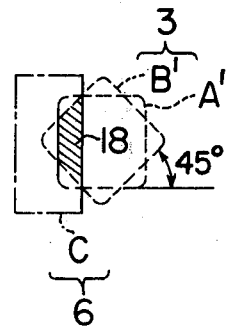
FIG. 4 is a view for explaining another embodiment of the present invention.

FIG. 4 is a view for explaining another embodiment of the present invention, and shows only shaping slit portions to stress these portions. Referring to FIG. 4, an octagonal slit having sharp corners is formed by an opening A' and another opening B' which is previously rotated 45 degrees from the opening A'. Further, in a shaping aperture corresponding to the shaping aperture 6 shown in FIG. 1, a rectangular slit is formed in a manner similar to that shown in FIGS. 3a to 3d.

Accordingly, the charged particle beam is deflected by the electrostatic deflector 4 placed between the shaping apertures 3 and 6, and therefore shaped into a beam having the form of a trapezoid, which illuminates the target 8. Similarly, a triangular or rhombic slit having sharp corners can be readily formed.

In the embodiments shown in FIGS. 3a to 3d and 4, two shaping apertures are piled. However, if the positioning projections or grooves can be formed with high accuracy, a shaping slit having the form of a rhomboid or trapezoid can be readily formed by appropriately piling three or more shaping apertures.

Further, in a case where the positioning projections for indicating the positional relation between the shaping apertures are formed, as shown in FIG. 3a, at a predetermined angular interval, it is possible to form a fine, exact slit by thin-disc shaping apertures of the same form.

We claim:

1. A shaping aperture used in a charged particle forming system and provided with a slit for shaping the cross section of a charged particle beam emitted, comprising:
at least two thin plates, each provided with a through-hole for passing said charged particle beam therethrough, said thin plates being piled and fixed in contact with each other so as to form a shaping slit of a desired form defined exclusively by linear edge portions of the thin plates bounding said through-holes.

2. A shaping aperture according to claim 1, wherein said through-hole has the form of a rectangle.

3. A shaping aperture according to claim 1, wherein said thin plates have the same form.

4. A shaping aperture according to claim 2, wherein said thin plates have the same form.

5. In a charged particle forming system comprising a source for producing a charged particle beam, first and second shaping apertures mounted in a column so as to be situated in alignment along the path of the charged particle beam produced by said source for shaping the cross section thereof, an electrostatic deflector disposed between said first and second shaping apertures for deflecting the charged particle beam, passing through said first shaping aperture, onto said second shaping aperture, and a target plane to be exposed with a shaped charged particle beam from said second shaping aperture, each of said first and second shaping apertures comprising at least two thin plates, each of which is provided with a through-hole for passing said charged particle beam therethrough, said thin plates of each shaping aperture being piled and fixed in direct contact with each other so as to form a shaping slit of a desired pattern defined only by linear edge portions of the thin plates bounding the through-holes therein.

6. A shaping aperture according to claim 5, wherein each of said thin plates is provided with a projection or a groove for aligning the thin plates in a desired positional relation with respect to each other.

7. A shaping aperture according to claim 5, wherein said through-hole has the form of a rectangle.

8. A shaping aperture according to claim 5, wherein said thin plates have the same form.

9. A shaping aperture according to claim 7, wherein said thin plates have the same form.

10. A shaping aperture according to claim 5, wherein each of said thin plates is provided with a projection or a groove for indicating the positional relation between said thin plates.

11. A shaping aperture according to claim 7, wherein each of said thin plates is provided with a projection or a groove for aligning the thin plates in a desired positional relation with respect to each other.

12. A shaping aperture according to claim 8, wherein each of said thin plates is provided with a projection or a groove for aligning the thin plates in a desired positional relation with respect to each other.

13. A shaping aperture according to claim 6, wherein each of said thin plates is provided with a projection or a groove for aligning the thin plates in a desired positional relation with respect to each other.

* * * * *